United States Patent
Iwamatsu (10) Patent No.: US 7,961,044 B2
(45) Date of Patent: Jun. 14, 2011

(54) AMPLIFIER

(75) Inventor: Masayuki Iwamatsu, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 15 days.

(21) Appl. No.: 12/592,308

(22) Filed: Nov. 23, 2009

(65) Prior Publication Data

US 2010/0127778 A1   May 27, 2010

(30) Foreign Application Priority Data

Nov. 27, 2008   (JP) .................................. 2008-302239

(51) Int. Cl.
*H03G 3/20* (2006.01)
(52) U.S. Cl. ........................................ 330/140; 330/141
(58) Field of Classification Search .................. 330/129, 330/140, 141
See application file for complete search history.

(56) References Cited

U.S. PATENT DOCUMENTS

| 6,590,619 B1 * | 7/2003 | Kawano .................... 348/738 |
| 7,551,031 B2 | 6/2009 | Iwamatsu |
| 2009/0091355 A1 | 4/2009 | Iwamatsu |

FOREIGN PATENT DOCUMENTS

JP  2002368563  12/2002

* cited by examiner

*Primary Examiner* — Steven J Mottola
(74) *Attorney, Agent, or Firm* — Pillsbury Winthrop Shaw Pittman LLP (57) ABSTRACT

An amplifier includes: a variable gain unit that adjusts an amplitude of an input signal and outputs a first signal; an amplitude limiting unit that limits an amplitude of the first signal and outputs a second signal set to have an amplitude of a first amplitude value or less; an amplifying unit that amplifies the second signal to output the amplified second signal as an output signal; and a control unit that detects when the first signal has an amplitude of a second amplitude value or more to control a gain of the variable gain unit so that the amplitude of the first signal becomes less than the second amplitude value, the second amplitude value being larger than the first amplitude value.

10 Claims, 7 Drawing Sheets

AMPLIFIER

BACKGROUND OF THE INVENTION

1. Technical Field

The present invention relates to an amplifier, and more particularly, to an amplifier that detects a predetermined degree of excessive input and controls attenuation of an input signal.

2. Background Art

Conventionally, an amplitude limiter circuit is sometimes used for output of an amplifier or inside of a circuit of the amplifier in order not to supply excessive input to an apparatus connected to an output side of the amplifier (see JP-A-2002-368563, for example).

The amplitude limiter circuit, because of limiting the peak value of an output signal, allows preventing the apparatus connected to the output side of the amplifier from being broken by excessive input.

However, in the conventional art, when the amplitude of an input signal increases over a level at which limitation in amplitude is started, the output signal waveform of the amplifier is clipped. When the amplitude of an input signal further increases, the distortion factor of an output signal increases therewith, and the output signal waveform approximates a square wave. When the output signal waveform then becomes a square wave, two times as much as an applied power becomes necessary for the amplifier to supply an output signal to the subsequent apparatus, as compared to that in the case of sine waves where the output signal waveform is not clipped.

SUMMARY OF THE INVENTION

The present invention has been made in view of such circumstances, and an object to be achieved is to permit a certain degree of excessive input, while suppressing an increase in applied power when the amplitude of an input signal has increased.

In order to achieve the above object, there is provided an amplifier according to the present invention includes: a variable gain unit that adjusts an amplitude of an input signal and outputs a first signal; an amplitude limiting unit that limits an amplitude of the first signal and outputs a second signal set to have an amplitude of a first amplitude value or less; an amplifying unit that amplifies the second signal to output the amplified second signal as an output signal; and a control unit that detects when the first signal has an amplitude of a second amplitude value or more to control a gain of the variable gain unit so that the amplitude of the first signal becomes less than the second amplitude value, the second amplitude value being larger than the first amplitude value.

According to the present invention, the amplitude of a first signal obtained by adjusting the amplitude of an input signal in the variable gain unit is limited. Accordingly, the amplitude of the first signal is less than the second amplitude value even when the amplitude of the input signal increases, and thus the volume of a signal to be lost as a result of the amplitude being limited in the amplitude limiting unit (the amount of clipping) has a certain limit, and the amount of clipping is given by a difference between the second amplitude value and the first amplitude value. Therefore, it can be suppressed by appropriately setting the second amplitude value and the first amplitude value that the waveform of the output signal approximates a square wave with an increase in amplitude of the input signal. As a result, not only can breaking of an apparatus connected at a subsequent stage of the amplifier be prevented, but an applied power can also be substantially reduced, and a certain degree of excessive input can be permitted.

In the amplifier, the amplifying unit may include a negative feedback amplifier circuit that amplifies the second signal by use of an operational amplifier. The control unit may compare a potential difference between an non-inverting input terminal and an inverting input terminal of the operational amplifier with a reference potential, and detects when clipping has occurred in an output signal of the negative feedback amplifier circuit based on a result of the comparison to control the gain of the variable gain unit so that clipping does not occur.

Here, when the negative feedback amplifier circuit operates normally (when clipping has not occurred), the output signal of the negative feedback amplifier circuit has a value within the range of the power supply potential of the operational amplifier. In addition, the input signal to be input to the amplifier is normally set to such a value that the output signal of the negative feedback amplifier circuit falls within the range of the power supply potential of the operational amplifier. However, in such a configuration that, for example, a battery or the like for supplying the power supply potential of the operational amplifier is incorporated in the negative feedback amplifier circuit, due to deterioration of the battery, the range of the power supply potential of the operational amplifier may become narrower than the assumed range, and clipping may unexpectedly occur.

In the above configuration, the control unit detects that clipping has occurred based on a comparison result of a potential difference between a non-inverting input terminal and an inverting input terminal of an operational amplifier with a reference potential, and controls a gain of the variable gain unit so that clipping does not occur, and therefore, even when clipping unexpectedly occurs as described above, the occurrence of clipping can be detected to perform adjustment so that clipping does not occur.

Moreover, as a result of comparing a potential difference between a non-inverting input terminal and an inverting input terminal of an operational amplifier with a reference potential, it becomes possible to quantitatively grasp excessive input, and such a mode as to permit the occurrence of clipping up to a preset degree of excessive input can also be adopted. According to this mode, it becomes possible to prevent an unreasonably excessive input without impairing loudness.

Further, by adjusting the reference potential, adjustment can also be performed, when clipping due to a predetermined degree of excessive input is detected, so that clipping does not occur.

In the amplifier, a potential of an amplitude center of the first signal is provided as a first reference potential, and the amplitude limiting unit may include: a high potential-side limiter that limits the amplitude of the second signal so that potential of the second signal does not increase exceeding a first potential being a potential higher by a first voltage than the first reference potential; and a low potential-side limiter that limits the amplitude of the second signal so that potential of the second signal does not decrease below a second potential being a potential lower by the first voltage than the first reference potential, and the first amplitude value is given by a potential difference between the first potential and the second potential.

In the amplifier, a potential of an output terminal from which the amplitude limiting unit outputs the second signal is provided as a second reference potential, and the control unit may include: a first comparator that compares a third potential higher by a second voltage than the second reference potential with potential of the first signal, and makes a detection signal effective when the potential of the first signal is higher than the third potential; a second comparator that compares a fourth potential lower by a second voltage than the second reference potential with potential of the first signal, and makes the detection signal effective when the potential of the first signal is lower than the fourth potential; and an integrating section that integrates the detection signal, and the control unit supplies an output signal of the integrating section as a control signal to the variable gain unit.

Further, the integrating section may differ in time constant between at rising and at falling of an output signal of the comparing unit. In this case, the stability of the negative feedback system is secured.

Further, the time constant at rising may be smaller than the time constant at falling. Thus, it is possible to realize a relatively fast attack time so as to prevent unreasonably excessive input and a relatively slow releasing time for gradual recovery.

DETAILED DESCRIPTION OF PREFERRED EMBODIMENTS

1. First Embodiment

Figure 1:
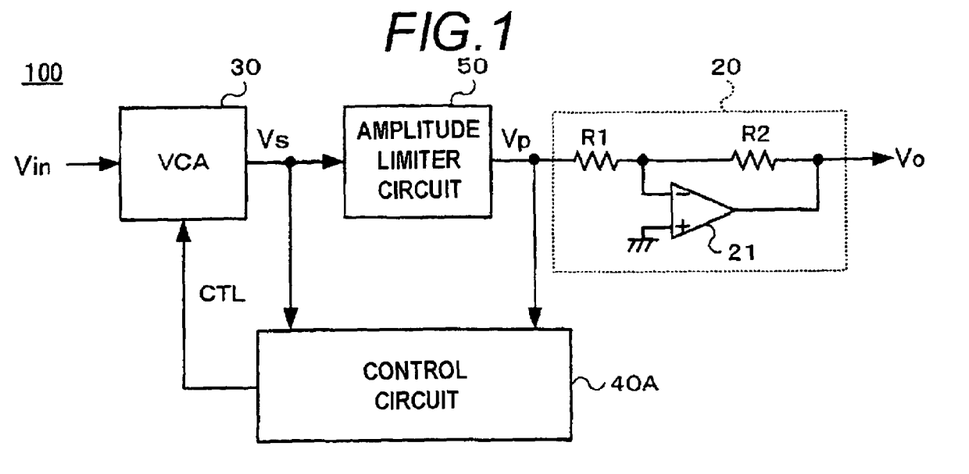
FIG. 1 is a circuit diagram showing a configuration of an amplifier of a first embodiment.

Hereinafter, an embodiment of the present invention will be described with reference to the drawings. FIG. 1 is a block diagram showing a configuration of an amplifier of the present embodiment. As shown in FIG. 1, an amplifier 100 amplifies an input signal Vin and outputs the amplified signal as an output signal Vo. The amplifier 100 includes an inverting negative feedback amplifier circuit 20, a voltage controlled attenuator (VCA) 30 that attenuates the input signal Vin where appropriate, a control circuit 40A that generates a control voltage CTL for controlling the VCA 30, and an amplitude limiter circuit 50 that limits the amplitude of an output signal Vs of the VCA 30.

It is assumed that each amplitude center of the input signal Vin and the output signal Vs of the VCA 30 is a ground potential GND. The negative feedback amplifier circuit 20 includes an input resistor R1, a feedback resistor R2, and an operational amplifier 21 that operates at a power supply potential of ±Vcc.

Figure 2:
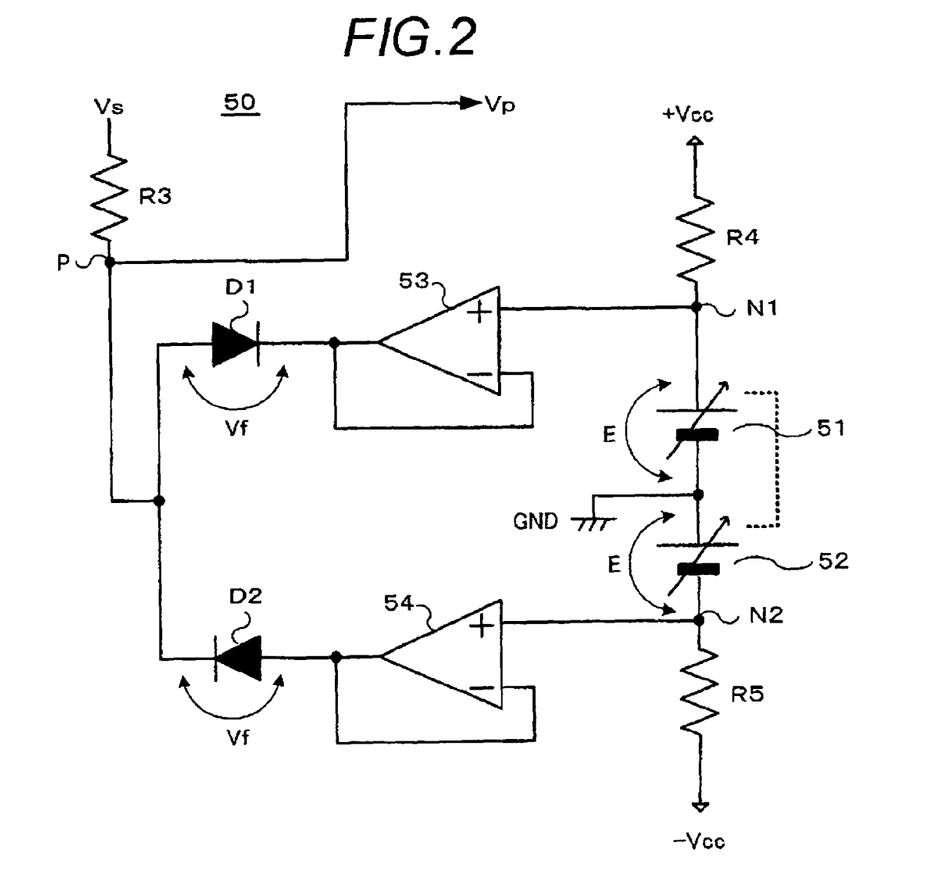
FIG. 2 is a circuit diagram showing a configuration of an amplitude limiter circuit to be used for the first embodiment.

The amplitude limiter circuit 50 limits the amplitude of the output signal Vs (first signal) of the VCA 30 and outputs an output signal Vp (second signal), the amplitude of which is set within a predetermined range. The output signal Vp of the amplitude limiter circuit 50 is supplied to the negative feedback amplifier circuit 20 and the control circuit 40A. A configuration of the amplitude limiter circuit 50 is shown in FIG. 2. The amplitude limiter circuit 50 includes an input resistor R3, and a resistor R4, voltage sources 51, 52, and a resistor R5 connected in series between power supply potentials +Vcc and −Vcc. The voltage sources 51, 52 each generate a voltage E, and a junction therebetween is grounded. Accordingly, a node N1 has a potential of +E, and a node N2 has a potential of −E. The resistors R4, R5 each function as a bias resistor.

The potential +E of the node N1 is supplied to a cathode of a diode D1 via a voltage follower 53, while the potential −E of the node N2 is supplied to an anode of a diode D2 via a voltage follower 54. Where the diodes D1 and D2 each have a fall voltage of Vf, the potential Vp of a node P is limited within the range indicated in formula (1).

$$Vf+E \geq Vp \geq -Vf-E \quad \text{Formula (1)}$$

Here, the diode D1 is turned on when the potential Vp of the node P becomes a high potential exceeding Vf+E, and the diode D2 is turned on when the potential Vp of the node P becomes a low potential below −Vf−E.

More specifically, the diode D1, the voltage follower 53, the voltage source 51, and the resistor R4 function as a high potential-side limiter that limits the amplitude of the node P so that the potential Vp (second signal) of the node P does not increase exceeding a potential higher by Vf+E than the ground potential GND (central potential). On the other hand, the diode D2, the voltage follower 54, the voltage source 52, and the resistor R5 function as a low potential-side limiter that limits the amplitude of the node P so that the potential (second signal) of the node P does not decrease below −Vf−E being a potential lower by Vf+E than the ground potential GND (central potential).

Then, the amplitude limiter circuit 50, where a potential difference (Vf+E)×2 between Vf+E (first potential) and −Vf−E (second potential ) is provided as a first amplitude value, generates such an output signal Vp that the amplitude of the output signal Vs of the VCA 30 has the first amplitude value or less.

Figure 3:
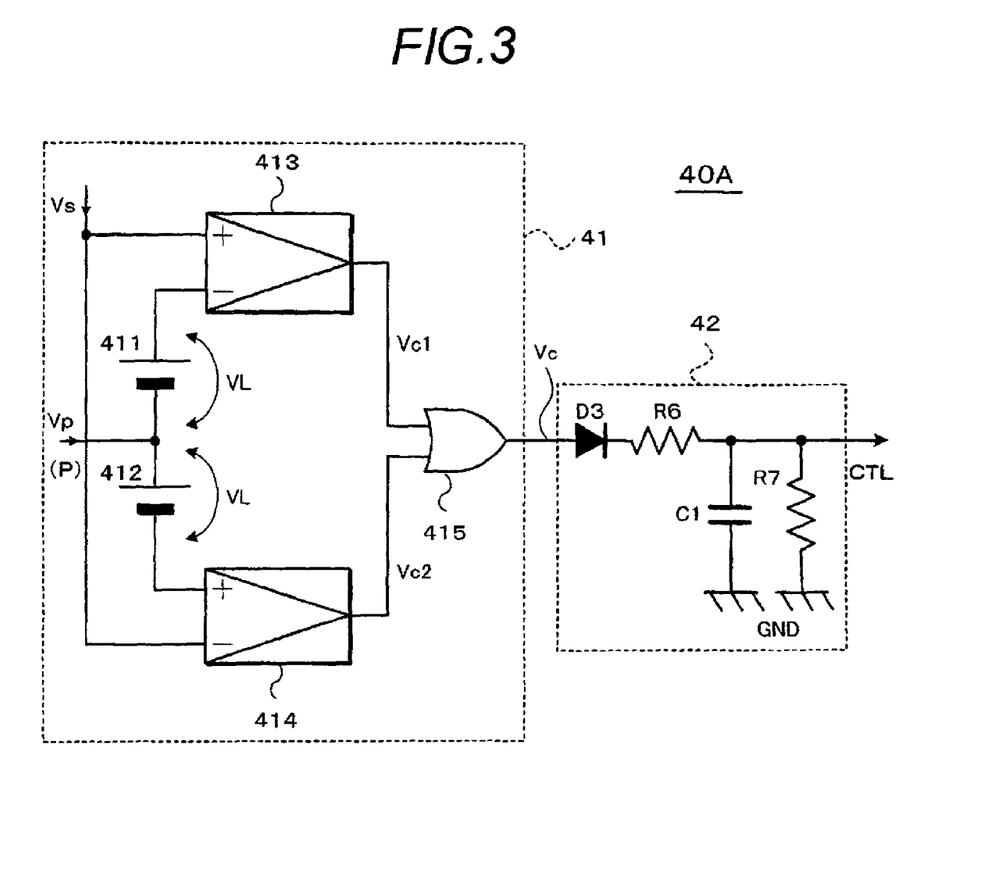
FIG. 3 is a circuit diagram showing a configuration of a control circuit to be used for the first embodiment.

A circuit configuration of the control circuit 40A is shown in FIG. 3. The control circuit 40A includes a comparison section 41 and a low-pass filter 42. The comparison section 41 includes voltage sources 411 and 412 each applying a voltage VL, comparators 413 and 414, and an OR circuit 415. A low potential-side terminal of the voltage source 411 and a high potential-side terminal of the voltage source 412 are connected to the node P, and supplied with the potential Vp. Moreover, a high potential-side terminal of the voltage source 411 is connected to a negative input terminal of the comparator 413, while a low potential-side terminal of the voltage source 412 is connected to a positive input terminal of the comparator 414. Therefore, to the negative input terminal of the comparator 413, a potential of Vp+VL is input, and to the positive input terminal of the comparator 414, a potential of Vp−VL is input.

Accordingly, when the output signal Vs of the VCA 30 exceeds Vp+VL, an output signal Vc1 of the comparator 413 becomes high level, and when the output signal Vs of the VCA 30 falls below Vp−VL, an output signal Vc2 of the comparator 414 becomes high level. The OR circuit 415 calculates a logical sum of the output signal Vc1 and the output signal Vc2 to generate an output signal Vc. The output signal Vc becomes high level when the output signal Vs of the VCA 30 exceeds Vp+VL or the output signal Vs falls below Vp−VL.

More specifically, where (Vp+VL)×2=(Vf+E+VL)×2 is provided as a second amplitude value, the comparison section 41 makes the output signal Vc high level (effective) when the amplitude of the output signal Vs of the VCA 30 has the second amplitude value or more.

Next, the output signal Vc of the comparison section 41 is supplied to the low-pass filter 42 (integration circuit). The low-pass filter 42 is provided for securing stability of a feedback system, and regulates attack time and release time individually. More specifically, as a result of making a resistor R7 sufficiently larger than a resister R6, an attack time determined by a time constant of the resistor R6 and a capacitor C1 is applied at the time of rising of the output signal Vc, and at the time of falling of the output signal Vc, no electric current flows to the resistor R6 due to a diode D3, so that a release time determined by a time constant of the resistor R7 and the capacitor C1 is applied. Generally, it is desirable, by setting the time constant at the time of rising shorter than the time constant at the time of falling, to realize a relatively fast attack time so as to prevent unreasonably excessive input and a relatively slow releasing time for gradual recovery. The control circuit 40A thereby controls the VCA 30 so that the amplitude of the output signal Vs of the VCA 30 has less than the second amplitude value (Vp+VL)×2.

Figure 4:
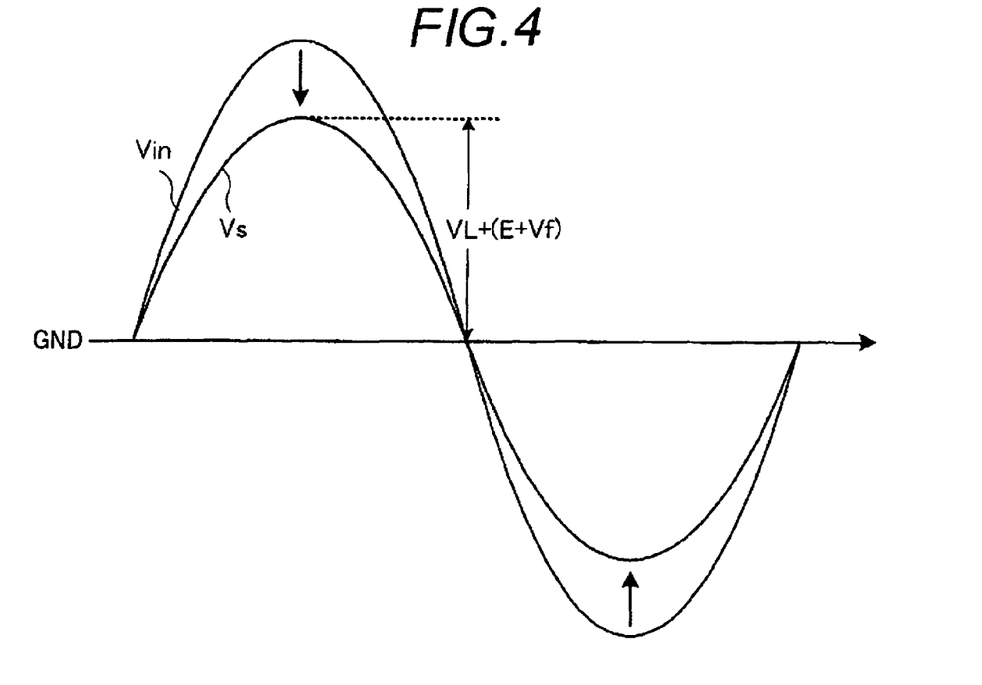
FIG. 4 is a waveform chart for explaining operation of the amplifier of the first embodiment.

Next, operation of the amplifier 100 will be described. It is supposed that the amplitude of the input signal Vin has increased and its positive peak value has exceeded VL+(E+Vf) as shown in FIG. 4. In this case, the output signal Vc of the comparison section 41 becomes high level, and the control voltage CTL to be supplied to the VCA 30 is increased. Then, the amount of attenuation of the VCA 30 increases, and the output signal Vs of the VCA 30 has a positive peak value of VL+(E+Vf) as shown in FIG. 4.

Figure 5:
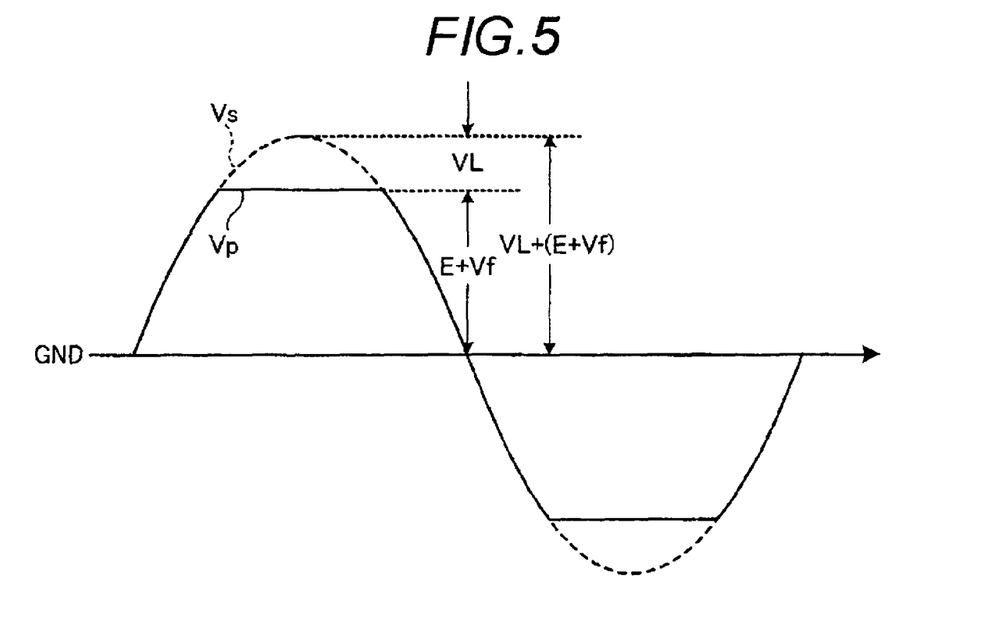
FIG. 5 is a waveform chart for explaining operation of the amplifier of the first embodiment.

The output signal Vs, as shown in FIG. 5, in the amplitude limiter circuit 50, is clipped at a level of E+Vf. The output signal Vs thus limited in amplitude becomes the output signal Vp of the amplitude limiter circuit 50 to be supplied to the negative feedback amplifier circuit 20. This allows preventing the amplitude of the negative feedback amplifier circuit 20 from becoming excessively large to damage the subsequent devices. Further, according to the amplifier 100, such an advantage that the amount of clipping can be kept constant is provided.

Figure 6:
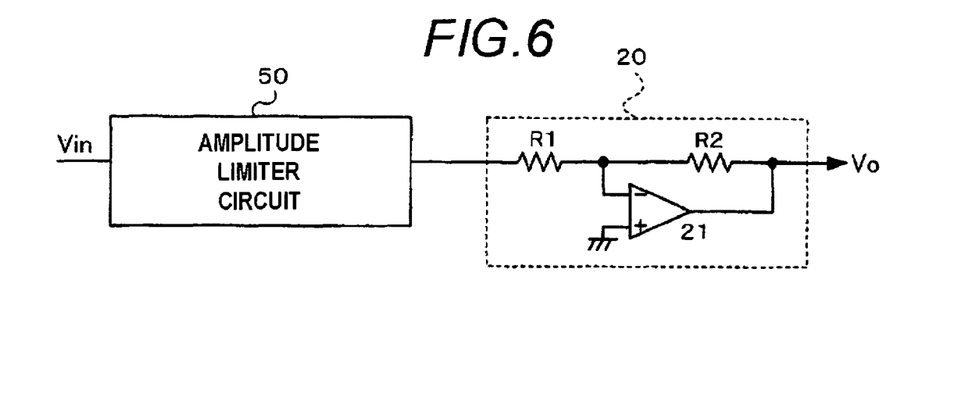
FIG. 6 is a circuit diagram showing a configuration of a comparative example.
Figure 7:
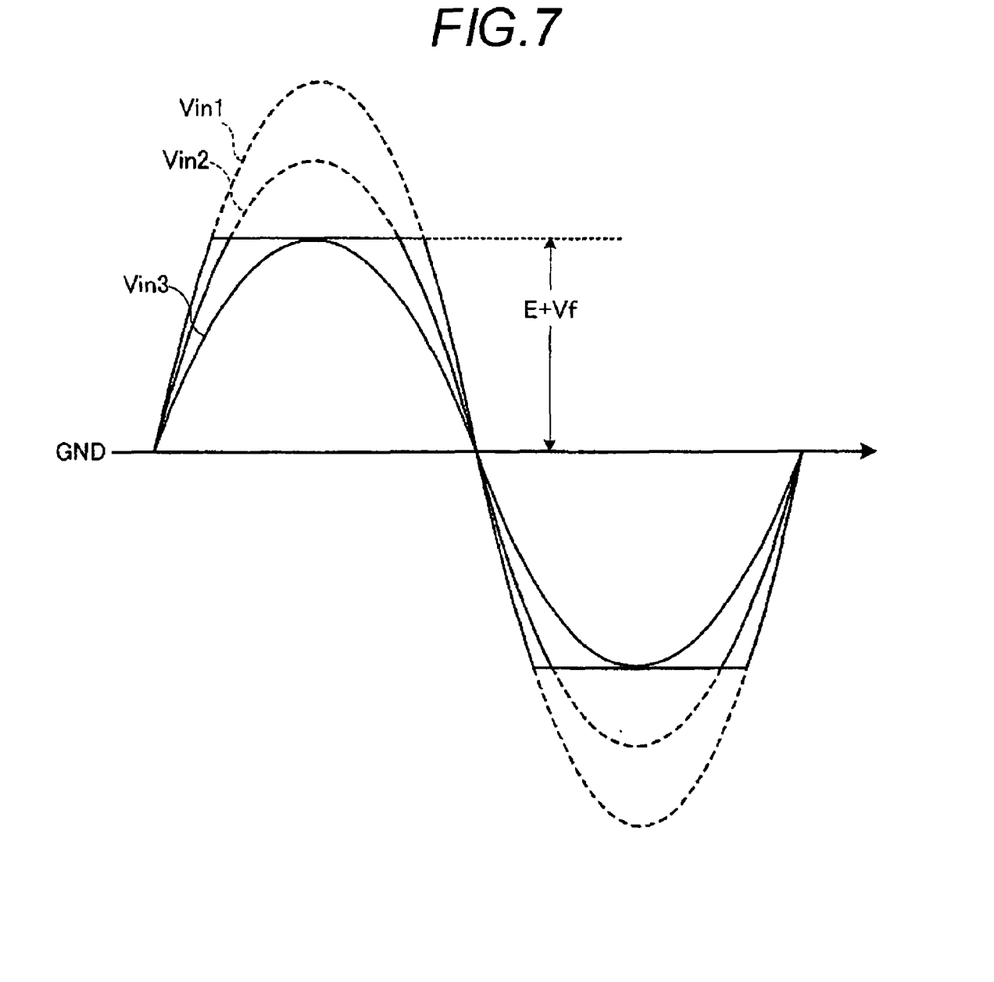
FIG. 7 is a waveform chart for explaining a problem of the comparative example.

This advantage will be described in detail while taking up a comparative example. Here, assumed as a comparative example is a configuration as shown in FIG. 6 where the VCA 30 and the control circuit 40A are excluded from the amplifier 100 shown in FIG. 1, and an input signal Vin is supplied to the negative feedback amplifier circuit 20. When Vin1, Vin2, and Vin3 shown in FIG. 7 are supplied as the input signal Vin, their positive peaks are limited, by the amplitude limiter circuit 50 by the potential E+Vf. Because the output signal Vo is equal to R2/R1 times the clipped waveform shown in FIG. 7, the waveform of the output signal Vo gradually approximates a square wave when the amplitude of the input signal Vin is increased. Then, when the waveform completely becomes a square wave, the power becomes two times as much as that in the case of a sine wave.

By contrast, in the present embodiment, the amplitude is limited by the amplitude limiter circuit 50 after attenuating without clipping the input signal Vin by using the VCA 30, and therefore the amount of clipping becomes VL at a maximum even when the amplitude of the input signal Vin increases as shown in FIG. 5. Accordingly, by appropriately setting the volume of VL, an applied power to the subsequent devices that normally leads to two times can be reduced to an applied power of nearly one time, so that breaking of a subsequent devices due to excessive input can be prevented.

Here, where VL=0, the amount of clipping also becomes "0." However, providing the amount of clipping as "0" results in a powerless sound reproduction lacking loudness. On the other hand, even when clipping occurs, a state of clipping up to a certain degree of distortion is not always offensive to human ears. Therefore, in the present embodiment, the occurrence of clipping is permitted up to a preset degree of excessive input. That is, the maximum amount of clipping of VL is expected. This makes it possible to reproduce a realistic sound.

2. Second Embodiment

Figure 8:
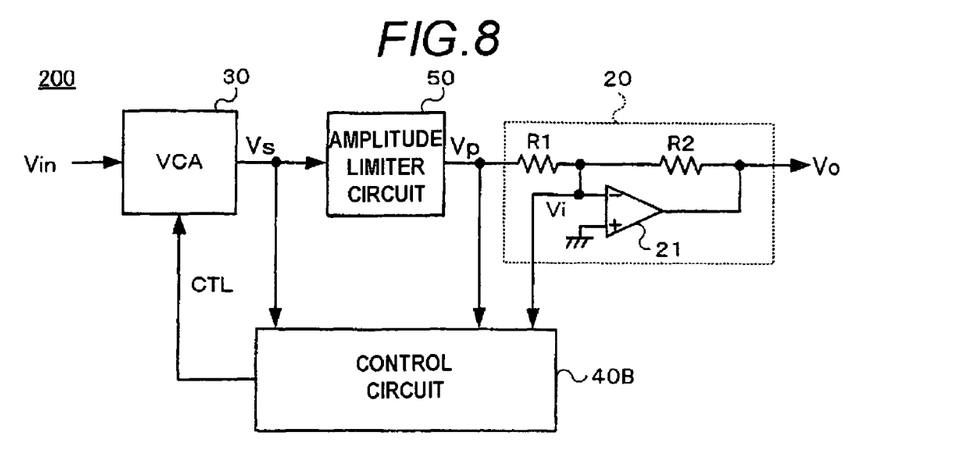
FIG. 8 is a circuit diagram showing a configuration of an amplifier of a second embodiment.

Next, a second embodiment of the present invention will be described. FIG. 8 is a block diagram of an amplifier 200 according to a second embodiment. The amplifier 200 has the same configuration as that of the amplifier 100 of the first embodiment shown in FIG. 1, except for adopting a control circuit 40B in place of the control circuit 40A, and supplying a potential Vi of a negative input terminal of the operational amplifier 21 to the control circuit 40B.

Figure 9:
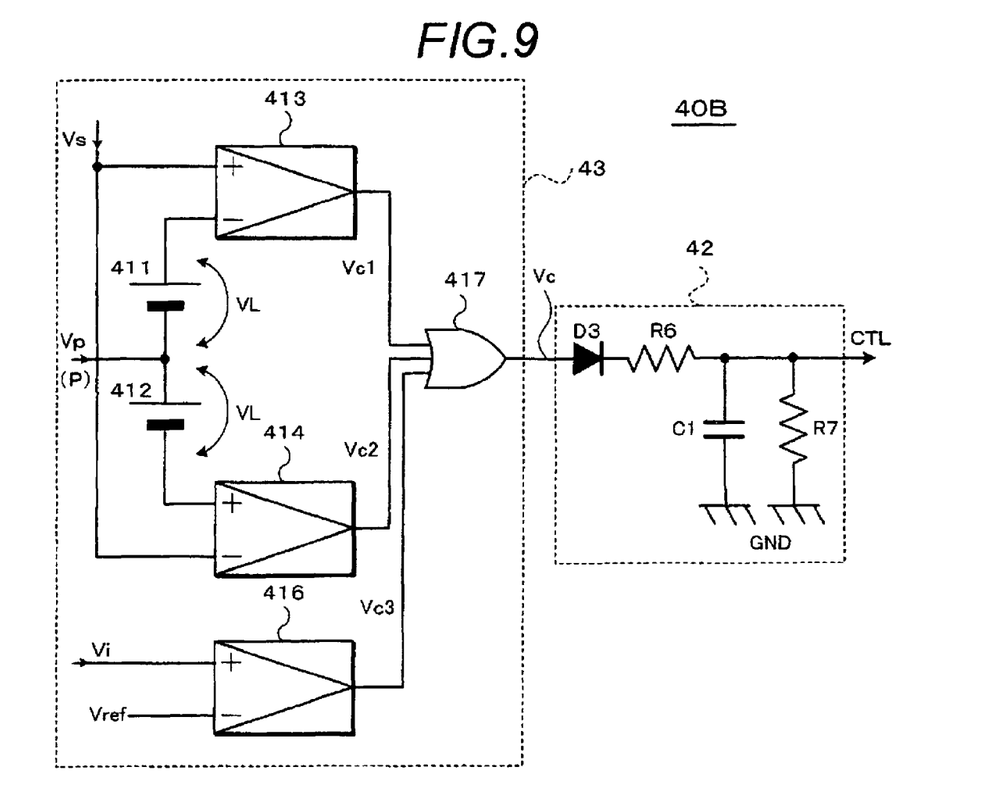
FIG. 9 is a circuit diagram showing a configuration of a control circuit to be used for the second embodiment.

A configuration of the control circuit 40B is shown in FIG. 9. The control circuit 40B is different from the control circuit 40A shown in FIG. 3 in adopting a comparison section 43 in place of the comparison section 41. The comparison section 43 has the same configuration as that of the comparison section 41, except for including a comparator 416, and using a 3-input OR circuit 417.

To a positive input terminal of the comparator 416, the potential Vi of the negative input terminal of the operational amplifier 21 is supplied. To a negative input terminal thereof, a reference potential Vref is supplied from a voltage source (not shown). Accordingly, when the potential Vi exceeds the reference potential Vref, an output signal Vc3 of the comparator 416 becomes high level. As a result, a control voltage CTL increases, and a feedback control is executed so that the amount of attenuation of the VCA 30 increases.

Figure 10:
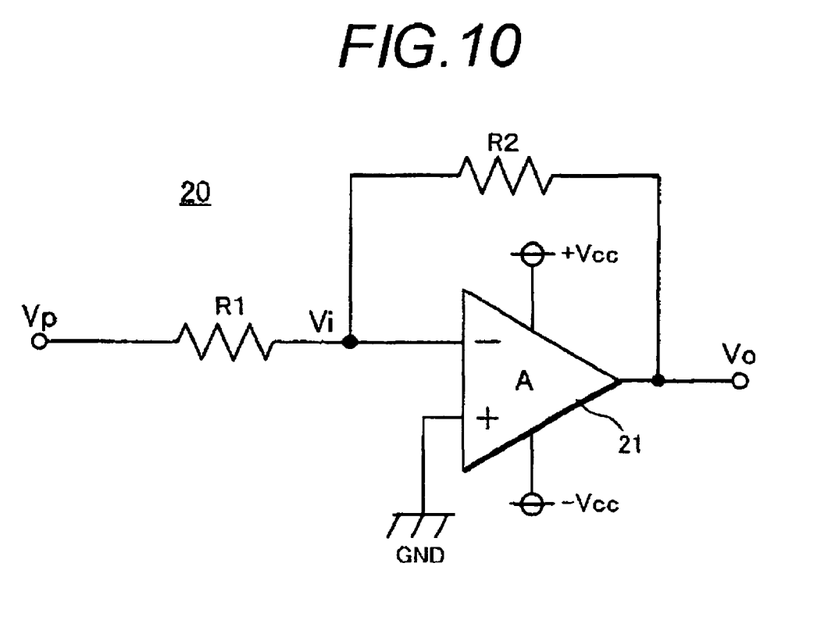
FIG. 10 is a diagram again showing a negative feedback amplifier circuit of the amplifier.

Here, referring to FIG. 10 showing the detailed construction of the negative feedback amplifier circuit 20 of the amplifier 200, the concept of the present embodiment will be described. Generally, in the inverting negative feedback amplifier circuit 20, the following relationship holds, where A represents a gain of the operational amplifier 21.

$$\begin{cases} \dfrac{(Vp - Vi)}{R1} + \dfrac{(Vo - Vi)}{R2} = 0 \\ Vo = -A \cdot Vi \end{cases} \quad \text{[Formula 1]}$$

Accordingly, an input/output gain in a state of use as a normal negative feedback amplifier circuit is as indicated below. The state of use as a normal negative feedback amplifier circuit refers to a state where the output Vo is within a range of ±Vcc, and no clipping has occurred.

$$\frac{Vo}{Vp} = -\frac{AR2}{AR1 + (R1 + R2)} \quad \text{[Formula 2]}$$

Moreover, the following is obtained.

$$Vi = \frac{R2}{AR1 + (R1 + R2)} \cdot Vp \quad \text{[Formula 3]}$$

Here, when the gain A is sufficiently large, it can be regarded that $$\frac{Vo}{Vp} = -\frac{R2}{R1} \quad \text{[Formula 4]}$$

Moreover, in the state of use as a normal negative feedback amplifier circuit, a positive input terminal and a negative input terminal of the operational amplifier 21 are in a virtual short-circuit state with the same potential, and because the positive input terminal is connected to a ground potential GND, Vi can be provided as 0.

Next, a state is considered where the potential Vp has been excessively increased, and clipping has occurred in the negative feedback amplifier circuit 20. Also, it is assumed here for simplicity that the potential Vp has been excessively increased in the positive direction. When clipping occurs, the output potential Vo of the operational amplifier 21 becomes almost equal to −Vcc, which is a power supply potential. A virtual short circuit is not created in this state, and the potential Vi of the negative input terminal takes a value corresponding to a value obtained by dividing a difference between the output potential Vo (=−Vcc) and the potential Vp by the resistor R1 and the resistor R2. More specifically, the following holds.

$$Vi = Vp - (Vp + Vcc) \cdot \frac{R1}{R1 + R2} \quad \text{[Formula 5]}$$

However, when an operational amplifier with specifications where a potential of the output signal Vo at clipping is less than the power supply potential −Vcc is used, the potential of the output signal Vo at clipping is used in place of the power supply potential −Vcc to calculate Vi. Alternatively, Vi may be experimentally obtained.

Figure 11:
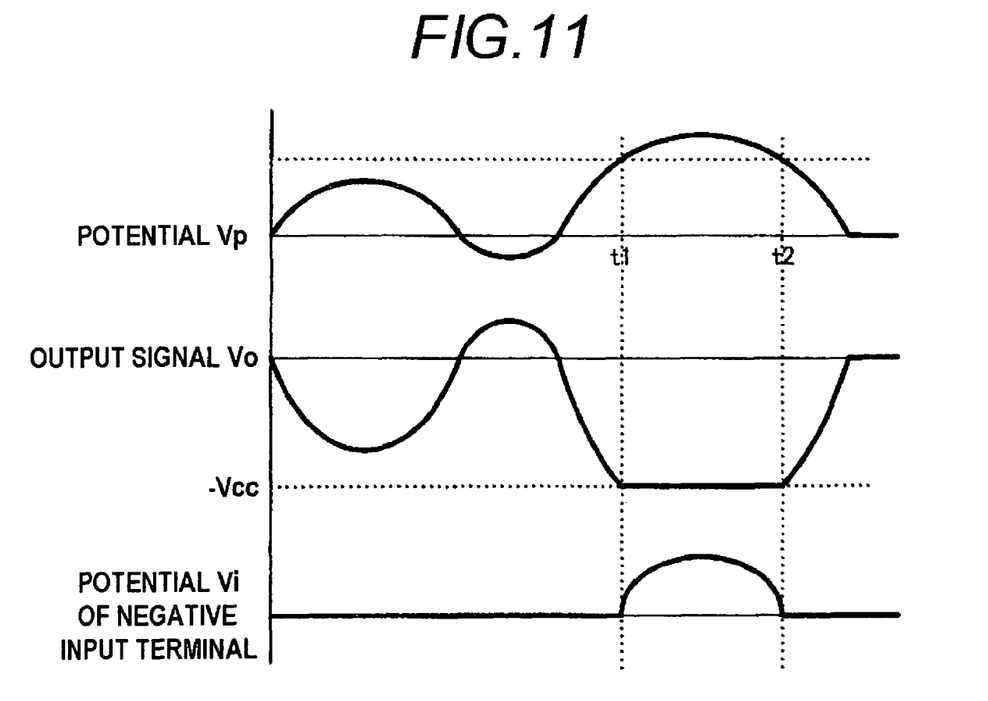
FIG. 11 is a chart showing a relationship between the potential Vp, the output signal Vo, and the potential Vi of a negative input terminal.

FIG. 11 is a chart showing a relationship between the potential Vp, the output signal Vo, and the potential Vi of a negative input terminal. In an example of FIG. 11, clipping does not occur and normal negative feedback amplification is performed until before time t1. Therefore, a virtual short circuit is created between the positive input terminal and the negative input terminal of the operational amplifier 21, and the potential Vi of the negative input terminal is almost 0. Moreover, for the output potential Vo, the potential Vp is inverted and amplified.

The amplitude of the potential Vp becomes excessively large in a period from the time t1 to t2, and the output signal Vo is clipped at −Vcc. A virtual short circuit is not created in this period, and the relationship of [Formula 5] is applied, and thus the potential Vi of the negative input terminal corresponds to the potential Vp. More specifically, detecting the potential Vi of the negative input terminal makes it possible to detect that the output signal Vo has been clipped.

In this case, by modifying [Formula 5], the following is obtained.

$$Vi = \frac{R2}{R1 + R2} Vp - \frac{R1}{R1 + R2} Vcc \quad \text{[Formula 6]}$$

Because the values of the resistor R1, resistor R2, and power supply potential Vcc are constants, the potential Vi generated at the negative input terminal at the occurrence of clipping is proportional to the potential Vp.

Further description will be given using more specific values. For example, a negative feedback amplifier circuit 20 having an amplification factor of 10 times with R1 of 1 kΩ and R2 of 10 kΩ will be taken as an example. Here, it is assumed that the gain A of the operational amplifier 21 is 80 dB (10000 times), and the power supply potential ±Vcc is ±10V.

Because the amplification factor is 10 times and the power supply potential is ±10V, the maximum input signal Vs in the case of use as a normal negative feedback amplifier circuit without clipping is 1V. In this case, because [Formula 3] is applied, the following is obtained.

$$\begin{aligned} Vi &= \frac{10\,k}{10000 \times 1k + (1k + 10k)} \cdot 1 \\ &= \frac{10}{10000 + 11} \\ &= 0.0009989\,V \\ &= 0.9989\,mV \end{aligned} \quad \text{[Formula 7]}$$

More specifically, because a virtual short circuit is created, the potential Vi of the negative input terminal is 1 mV or less, which can be regarded as almost 0.

Next, where Vp=1.1V to be an excessive input of 10% is supplied as the potential Vp to cause clipping, because [Formula 5] is applied, the following is obtained.

$$\begin{aligned} Vi &= 1.1 - (1.1 + 10) \cdot \frac{1k}{1k + 10k} \\ &= 0.090909\,V \\ &= 90.909\,mV \end{aligned} \quad \text{[Formula 8]}$$

Figure 12:
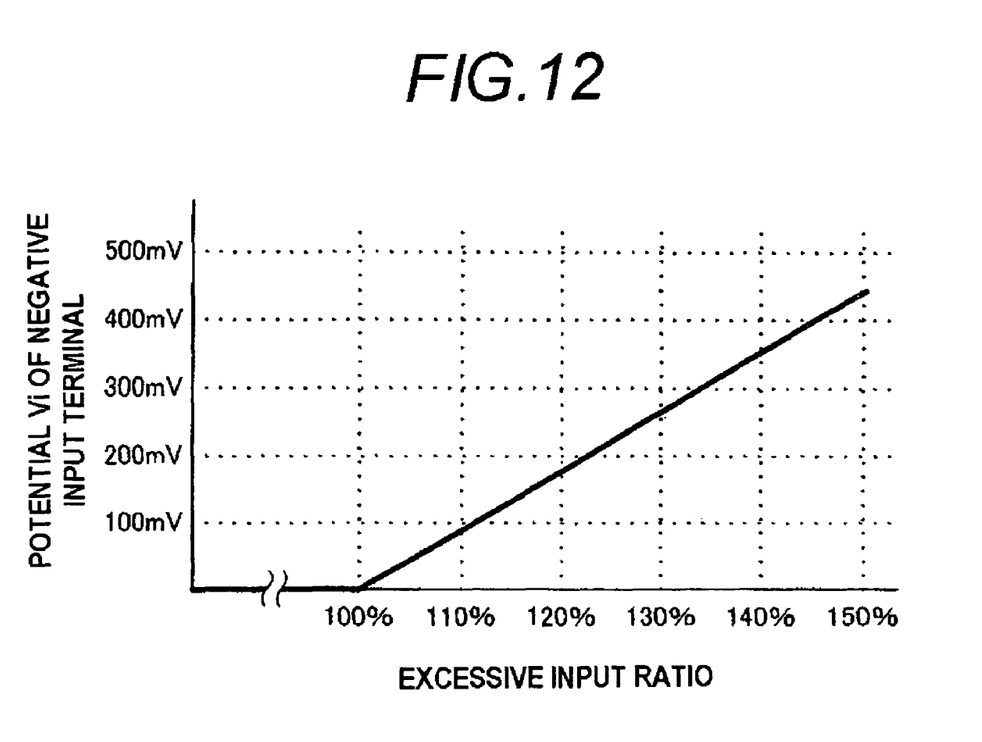
FIG. 12 is a chart showing a relationship between the degree of excessive input and the potential Vi of a negative input terminal.

More specifically, when clipping occurs due to an excessive input of 10%, the potential Vi of the negative input terminal is about 90 times as large as that when no clipping has occurred. Similarly, potentials Vi of the negative input terminal obtained for excessive inputs of 20%, 30%, 40%, and 50% are, as shown in FIG. 12, 181.82 mV, 272.73 mV, 363.64 mV, and 454.55 mV, respectively. As is also apparent from FIG. 12, the degree of excessive input has a linear relationship with the potential Vi of the negative input terminal at the occurrence of clipping, and thus the degree of excessive input can be quantitatively grasped from the potential Vi of the negative input terminal.

Referring back to FIG. 9, when the comparator 416 is set so as to operate at ±90.9 mV, that is, when Vref is set to ±90.9 mV, under the same conditions as the above specific values, it can be detected that clipping has occurred due to an excessive input of 10%. By controlling the VCA 30 based on the output signal Vc3 of the comparator 416 to attenuate the input signal Vin, an amplifier is obtained that permits clipping up to an excessive input of 10% and attenuates the input signal Vin at an excessive input of 10% or more. Similarly, by adjusting the operating potential of the comparator 416, that is, the reference potential Vref, clipping caused by an excessive input of 20%, 30%, 40%, or 50% can also be detected, so that when clipping caused by a predetermined degree of excessive input is detected, the VCA 30 is operated to attenuate the input signal Vin.

That is, in the present embodiment, it becomes possible to quantitatively grasp an excessive input, so that the occurrence of clipping is permitted up to a preset degree of excessive input. Such control is performed because it has been proved as a result of auditory testing that, even when clipping occurs, a state of clipping up to a certain degree of distortion is not always offensive to human ears. Consequently, in the present embodiment, it becomes possible to prevent an unreasonably excessive input without impairing loudness.

Although, in the above-mentioned embodiment, the voltage controlled attenuator (VCA) 30 is used as an attenuator of an input signal, the present invention is not limited thereto, and for example, an electronic volume by a resistance dividing method or the like may be used. In short, the attenuator of the input signal may be any variable gain unit for adjusting the amplitude of an input signal and outputting the resulting signal. Moreover, the present invention is applicable to various operation modes of an amplifier, besides Class A, Class AB, Class D, and the like. The comparator 416 for detecting the potential Vi of the negative input terminal generated at the occurrence of clipping may be provided individually for each of the positive and negative values of potential.

Moreover, as mentioned above, when the negative feedback amplifier circuit 20 operates normally (when clipping has not occurred), the output signal Vo of the negative feedback amplifier circuit 20 is within the range (−Vcc to +Vcc) of the power supply potential of the operational amplifier 21. In addition, the input signal Vin is normally set so that the output signal Vo falls within ±Vcc. However, in such a configuration that, for example, a battery or the like for supplying the power supply potential Vcc of the operational amplifier 21 is incorporated in the negative feedback amplifier circuit 20, due to deterioration of the battery, the range of the power supply potential of the operational amplifier 21 may become narrower than the assumed range, and clipping may unexpectedly occur.

According to the present embodiment, even when clipping unexpectedly occurs, the occurrence of clipping can be detected to perform adjustment so that clipping does not occur. In the above embodiment, the potential of the positive input terminal of the operational amplifier 21 is 0V (ground potential), so that a virtual short-circuit relationship is lost when the potential Vi of the negative input terminal is Vi>0, thus allowing to detect the occurrence of clipping, and more generally, when a potential difference between the positive input terminal and the negative input terminal of the operational amplifier has exceeded 0V, the occurrence of clipping can be detected. More specifically, it suffices that the control circuit 40B detects a potential difference between the positive input terminal and the negative input terminal of the operational amplifier and compares the detected potential difference with the reference potential Vref by the comparator 416.

Although, in the above embodiment, an inverting amplifier is used as the negative feedback amplifier circuit 20, this may, of course, be composed of a non-inverting amplifier using an operational amplifier. In this case, it suffices that the output signal Vp of the amplitude limiter circuit 50 is supplied to the positive input terminal of the operational amplifier, to provide the resistor R1 between the negative input terminal of the operational amplifier and the ground potential GND, and to provide the resistor R2 between the negative input terminal and the output terminal of the operational amplifier. In this case as well, clipping occurs when a virtual short-circuit relationship is lost as in the above embodiment.

Accordingly, clipping can be detected by monitoring the potential difference between the positive input terminal and the negative input terminal of the operational amplifier. This is the same as in the above embodiment. Therefore, it suffices to detect a potential difference between the positive input terminal and the negative input terminal of the operational amplifier and compare the detected potential difference with the reference potential Vref by the comparator 416. In addition, when the reference potential Vref is set to 0V, it suffices to connect one of the input terminals of the comparator 416 and the positive input terminal of the operational amplifier, and connect the other input terminal of the comparator 416 and the negative input terminal of the operational amplifier.

What is claimed is:

1. An amplifier, comprising:
a variable gain unit that adjusts an amplitude of an input signal and outputs a first signal;
an amplitude limiting unit that limits an amplitude of the first signal and outputs a second signal set to have an amplitude of a first amplitude value or less;
an amplifying unit that amplifies the second signal to output the amplified second signal as an output signal; and
a control unit that detects when the first signal has an amplitude of a second amplitude value or more to control a gain of the variable gain unit so that the amplitude of the first signal becomes less than the second amplitude value, the second amplitude value being larger than the first amplitude value.

2. The amplifier according to claim 1, wherein the amplifying unit includes a negative feedback amplifier circuit that amplifies the second signal by use of an operational amplifier, and
the control unit compares a potential difference between an non-inverting input terminal and an inverting input terminal of the operational amplifier with a reference potential, and detects when clipping has occurred in an output signal of the negative feedback amplifier circuit based on a result of the comparison to control the gain of the variable gain unit so that clipping does not occur.

3. The amplifier according to claim 1, wherein a potential of an amplitude center of the first signal is provided as a first reference potential, the amplitude limiting unit including:
a high potential-side limiter that limits the amplitude of the second signal so that potential of the second signal does not increase exceeding a first potential being a potential higher by a first voltage than the first reference potential; and
a low potential-side limiter that limits the amplitude of the second signal so that potential of the second signal does not decrease below a second potential being a potential lower by the first voltage than the first reference potential, and
wherein the first amplitude value is given by a potential difference between the first potential and the second potential.

4. The amplifier according to claim 3, wherein a potential of an output terminal from which the amplitude limiting unit outputs the second signal is provided as a second reference potential, the control unit including:
a first comparator that compares a third potential higher by a second voltage than the second reference potential with potential of the first signal, and makes a detection signal effective when the potential of the first signal is higher than the third potential;

a second comparator that compares a fourth potential lower by a second voltage than the second reference potential with potential of the first signal, and makes the detection signal effective when the potential of the first signal is lower than the fourth potential; and an integrating section that integrates the detection signal, and the control unit supplies an output signal of the integrating section as a control signal to the variable gain unit.

5. The amplifier according to claim 4, wherein the integrating section differs in time constant between at rising and at falling of an output signal of the comparing unit.

6. The amplifier according to claim 5, wherein the time constant at rising is smaller than the time constant at falling.

7. The amplifier according to claim 2, wherein a potential of an amplitude center of the first signal is provided as a first reference potential, the amplitude limiting unit including:

a high potential-side limiter that limits the amplitude of the second signal so that potential of the second signal does not increase exceeding a first potential being a potential higher by a first voltage than the first reference potential; and a low potential-side limiter that limits the amplitude of the second signal so that potential of the second signal does not decrease below a second potential being a potential lower by the first voltage than the first reference potential, and wherein the first amplitude value is given by a potential difference between the first potential and the second potential.

8. The amplifier according to claim 7, wherein a potential of an output terminal from which the amplitude limiting unit outputs the second signal is provided as a second reference potential, the control unit including:

a first comparator that compares a third potential higher by a second voltage than the second reference potential with potential of the first signal, and makes a detection signal effective when the potential of the first signal is higher than the third potential;

a second comparator that compares a fourth potential lower by a second voltage than the second reference potential with potential of the first signal, and makes the detection signal effective when the potential of the first signal is lower than the fourth potential; and an integrating section that integrates the detection signal, and the control unit supplies an output signal of the integrating section as a control signal to the variable gain unit.

9. The amplifier according to claim 8, wherein the integrating section differs in time constant between at rising and at falling of an output signal of the comparing unit.

10. The amplifier according to claim 9, wherein the time constant at rising is smaller than the time constant at falling.

* * * * *